US00RE40705E

(19) United States
(12) Reissued Patent
Nakayama et al.

(10) Patent Number: US RE40,705 E
(45) Date of Reissued Patent: May 5, 2009

(54) HIGH-BREAKDOWN-VOLTAGE SEMICONDUCTOR APPARATUS

(75) Inventors: Kazuya Nakayama, Sagamihara (JP); Koichi Sugiyama, Yokohama (JP)

(73) Assignee: Kabushiki Kaisha Toshiba, Kawasaki-shi (JP)

(21) Appl. No.: 10/101,778

(22) Filed: Mar. 21, 2002

Related U.S. Patent Documents

Reissue of:
(64) Patent No.: 6,040,598
Issued: Mar. 21, 2000
Appl. No.: 09/042,614
Filed: Mar. 17, 1998

(30) Foreign Application Priority Data

Mar. 18, 1997 (JP) ..... 9-065146
Mar. 10, 1998 (JP) ..... 10-057956

(51) Int. Cl.
*H01L 29/76* (2006.01)

(52) U.S. Cl. ..... 257/329; 257/139; 257/341; 257/262; 257/401; 257/E29.198

(58) Field of Classification Search ..... 257/329, 257/330, 331, 332, 139, 341, 262, 401, E29.028, 257/E29.066, E29.067, E29.167, E29.18, 257/E21.382
See application file for complete search history.

(56) References Cited

U.S. PATENT DOCUMENTS 5,178,370 A * 1/1993 Clark et al. ..... 257/212
5,313,088 A * 5/1994 Takahashi et al. ..... 257/328
5,623,151 A * 4/1997 Ajit ..... 257/212
5,686,750 A * 11/1997 Takahashi ..... 257/328
5,703,383 A * 12/1997 Nakayama
5,962,877 A * 10/1999 Sakurai et al. ..... 257/139
6,096,607 A * 8/2000 Ueno ..... 438/268

FOREIGN PATENT DOCUMENTS

| | | |
|---|---|---|
| JP | 2-153570 | 6/1990 |
| JP | 5-259462 | * 10/1993 |
| JP | 5-315618 | 11/1993 |
| JP | 8-88550 | * 4/1996 |
| JP | 8-340103 | * 12/1996 |

* cited by examiner

*Primary Examiner*—Victor A. Mandala, Jr.
(74) *Attorney, Agent, or Firm*—Oblon, Spivak, McClelland, Maier & Neustadt, P.C.

(57) ABSTRACT

A high-breakdown-voltage semiconductor apparatus is provided, wherein when a gate capacitance of that portion of a gate electrode, under which a channel is formed, is Cg [F], a resistance in a channel length direction of that portion of the gate electrode, under which the channel is formed, is Rg [Ω], a threshold voltage, which is to be applied to the gate electrode and application of which permits flow of a drain current, is Vth [V], a voltage to be applied to the gate electrode to cut off the drain current is Voff [V], and a ratio of increase in the drain voltage per unit time at the time of cutting off the drain current is dV/dt [V/s], the following condition is satisfied:

$$|Vt-Voff| \geqq 0.5 \cdot Cg \cdot Rg \cdot (dV/dt).$$

14 Claims, 9 Drawing Sheets

HIGH-BREAKDOWN-VOLTAGE SEMICONDUCTOR APPARATUS

Matter enclosed in heavy brackets [ ] appears in the original patent but forms no part of this reissue specification; matter printed in italics indicates the additions made by reissue.

*More than one reissue application has been filed for the reissue Pat. No. 6,040,598. The reissue application numbers are application Ser. Nos. 10/101,778 and 10/367,939.*

BACKGROUND OF THE INVENTION

The present invention relates generally to a high-breakdown-voltage semiconductor apparatus and more particularly to a high-breakdown-voltage semiconductor apparatus having a plurality of IGBTs.

An IGBT (Insulated Gate Bipolar Transistor) is known as one of high-breakdown-voltage semiconductor devices used in a high-breakdown-voltage apparatus for performing power control. The IGBT is a modern device having both high-speed switching characteristics of a MOSFET and high-output characteristics of a bipolar transistor. IGBTs have recently been used in the wide field of power electronics, e.g. inverters, switching power supply, etc.

The IGBT, however, has the following problems.

In the IGBT, as compared to a high-breakdown-voltage semiconductor device such as a thyristor for latching-up, the amount of carriers injected from the source side is small and the turn on/off characteristics are degraded. In addition, since the thickness of the base layer increases as the breakdown voltage is higher (in particular, 3 kV or above), the turn on/off characteristics are more degraded.

In order to solve these problems, there is a technique to increase the width (gate width) of the gate electrode.

However, if the gate width is increased, the input capacitance or feedback capacitance of the MOS gate portion increases. Consequently, the switching speed lowers, the current or voltage varies at the time of switching, or malfunction occurs due to external noise. Such a decrease in switching speed or malfunction leads to unstable operations of the apparatus. In worst cases, the apparatus is destroyed.

In the conventional IGBT, as described above, the amount of carriers injected from the source side decreases and the turn on/off performance deteriorates as the breakdown voltage increases. If the gate width is increased in order to solve these problems, the switching speed lowers or malfunction occurs. Consequently, the operation of the apparatus becomes unstable.

BRIEF SUMMARY OF THE INVENTION

The present invention has been made in consideration of the above circumstances and its object is to provide a high-breakdown-voltage semiconductor apparatus wherein malfuncion of IGBTs can be prevented and stable operations ensured.

According to researches by the inventor, it has turned out that malfunction of an IGBT with a high breakdown voltage (in particular, 3 kV or above) is caused by re-striking which occurs when a displacement current has flown in the gate electrode, because of a drain voltage rise ratio dV/dt at the time of turn-off and a potential distribution has occurred in the gate electrode.

Thus, the re-striking of the device can be prevented if the gate capacitance or the resistance of the gate electrode is decreased to reduce the displacement current, thereby suppressing occurrence of a potential distribution within the gate electrode.

If the apparatus is designed such that the displacement current (dV/dt) satisfies the relationship, $|Vth-Voff| \geqq 0.5 \cdot Cg \cdot Rg \cdot (dV/dt)$, the re-striking due to displacement current can be prevented, as will be described below.

If the displacement current is suppressed, non-uniform operations of devices, e.g. concentration of current to part of devices, can be suppressed and the operations of respective devices can be well balanced. Therefore, the turn-off performances can be further enhanced.

In order to achieve the above object, according to a first aspect of the invention, there is provided a high-breakdown-voltage semiconductor apparatus comprising:

a first-conductivity-type base layer;

a second-conductivity-type base layer formed selectively on a surface of the first-conductivity-type base layer;

a first-conductivity-type source layer formed selectively on a surface of the second-conductivity-type base layer;

a gate electrode provided over that portion of the second-conductivity-type base layer, which is interposed between the first-conductivity-type source layer and the first-conductivity-type base layer, with a gate insulation film interposed between the gate electrode and the interposed portion of the second-conductivity-type base layer;

a second-conductivity-type drain layer formed on a surface of the first-conductivity-type base layer, which is opposed to the surface thereof on which the second-conductivity-type base layer;

a drain electrode put in contact with the second-conductivity-type drain layer; and a source electrode put in contact with the first-conductivity-type source layer and the second-conductivity-type base layer;

wherein when a gate capacitance of that portion of the gate electrode, under which a channel is formed, is Cg [F], a resistance in a channel length direction of that portion of the gate electrode, under which the channel is formed, is Rg [Ω], a threshold voltage, which is to be applied to the gate electrode and application of which permits flow of a drain current, is Vth [V], a voltage to be applied to the gate electrode to cut off the drain current is Voff [V], and a ratio of increase in the drain voltage per unit time at the time of cutting off the drain current is dV/dt [V/s], the following condition is satisfied:

$$|Vth-Voff| \geqq 0.5 \cdot Cg \cdot Rg \cdot (dV/dt)$$

According to a second aspect of the invention, there is provided the high-breakdown-voltage semiconductor apparatus of the first aspect, wherein a width of that portion of the gate electrode, at which the gate electrode is connected to gate electrode wiring, is greater than a width of the gate electrode.

According to a third aspect of the invention, there is provided the high-breakdown-voltage semiconductor apparatus of the first aspect, further comprising a second gate electrode formed on the gate electrode.

According to a fourth aspect of the invention, there is provided the high-breakdown-voltage semiconductor apparatus of the third aspect, wherein the gate electrode and the second gate electrode are covered with insulation films.

According to a fifth aspect of the invention, there is provided the high-breakdown-voltage semiconductor apparatus of the third aspect, wherein the source electrode is not provided on the second gate electrode.

According to a sixth aspect of the invention, there is provided the high-breakdown-voltage semiconductor apparatus of the first aspect, further comprising a first-conductivity-type emitter layer formed on the first-conductivity-type base layer and having an impurity dosage of $1\times10^{13}$ [$cm^{-3}$] or less and a peak concentration of $1\times10^{15}$ [$cm^{-3}$] or more and $1\times10^{16}$ [$cm^{-3}$] or less.

According to a seventh aspect of the invention, there is provided the high-breakdown-voltage semiconductor apparatus of the first aspect, wherein a thickness of that portion of the gate insulation film, which is formed below a central portion of the gate electrode, is different from a thickness of that portion of the gate insulation film formed below an end portion of the gate electrode.

According to an eighth aspect of the invention, there is provided the high-breakdown-voltage semiconductor apparatus of the first aspect, further comprising a resistor connected between the gate electrode and a gate power supply.

According to a ninth aspect of the invention, there is provided the high-breakdown-voltage semiconductor apparatus of the first aspect, wherein when a width of the gate electrode is $L_G$, a depth of the first-conductivity-type base layer is $D_B$, a thickness of the second-conductivity-type base layer is $W_B$, and a distance between the gate electrodes is $L_S$, the following condition is satisfied:

$$60\ \mu m \leqq L_G,\ 5 \leqq L_G/L_S, \text{ and } 1 \leqq L_G^2/(DB \cdot WB) \leqq 9$$

According to a tenth aspect of the invention, there is provided a high-breakdown-voltage semiconductor apparatus comprising:

a first-conductivity-type base layer;

a second-condutivity-type base layer formed on a surface of the first-conductivity-type base layer;

a first-conductivity-type source layer formed on a surface of the second-conductivity-type base layer;

a gate electrode provided over that portion of the second-conductivity-type base layer, which is interposed between the first-conductivity-type source layer and the first-conductivity-type base layer, with a gate insulation film interposed between the gate electrode and the interposed portion of the second-conductivity-type base layer;

a second-conductivity-type drain layer formed on a surface of the first-conductivity-type base layer, which is opposed to the surface thereof on which the second-conductivity-type base layer;

a drain electrode put in contact with the second-conductivity-type drain layer; and a source electrode put in contact with the first-conductivity-type source layer and the second-conductivity-type base layer, wherein when a gate capacitance of that portion of the gate electrode, under which a channel is formed, is Cg [F], a resistance in a channel length direction of that portion of the gate electrode, under which the channel is formed, is Rg [Ω], a threshold voltage, which is to be applied to the gate electrode and application of which permit flow of a drain current, is Vth [V], a voltage to be applied to the gate electrode to cut off the drain current is Voff [V], and a ratio of increase in the drain voltage per unit time at the time of cutting off the drain source is dV/dt [V/s], the following condition is satisfied:

$$|Vth-Voff| \geqq 0.5 \cdot Cg \cdot Rg \cdot (dV/dt)$$

and wherein the first-conductivity-type base layer is subjected to a local lifetime control process.

According to an eleventh aspect of the invention, there is provided a method of a driving the high high-breakdown-voltage semiconductor apparatuses, wherein each of the high high-breakdown-voltage semiconductor apparatuses comprises:

a first-conductivity-type base layer;

a second-conductivity-type base layer formed on a surface of the first-conductivity-type base layer;

a first-conductivity-type source layer formed on a surface of the second-conductivity-type base layer;

a gate electrode provided over that portion of the second-conductivity-type base layer, which is interposed between the first-conductivity-type source layer and the first-conductivity-type base layer, with a gate insulation film interposed between the gate electrode and the interposed portion of the second-conductivity-type base layer;

a second-conductivity-type drain layer formed on a surface of the first-conductivity-type base layer, which is opposed to the surface thereof on which the second-conductivity-type base layer;

a drain electrode formed on the second-conductivity-type drain layer; and a source electrode put in contact with the first-conductivity-type source layer and the second-conductivity-type base layer, wherein when a gate capacitance of that portion of the gate electrode, under which a channel is formed, is Cg [F], a resistance in a channel length direction of that portion of the gate electrode, under which the channel is formed, is Rg [Ω], a threshold voltage, which is to be applied to the gate electrode and application of which permits flow of a drain current, is Vth [V], a voltage to be applied to the gate electrode to cut off the drain current is Voff [V], and a ratio of increase in the drain voltage per unit time at the time of cutting off the drain current is dV/dt [V/s], the following condition is satisfied:

$$|Vth-Voff| \geqq 0.5 \cdot Cg \cdot Rg \cdot (dV/dt)$$

and wherein the method of driving the high-breakdown-voltage semiconductor apparatuses comprises the steps of:

applying a first voltage to at least one of gates of the high-breakdown-voltage semiconductor apparatus, which is lower than a gate voltage at turn-on time, and applying a second voltage for turning off to the at least one of the gates, which is lower than the first voltage.

According to a twelfth aspect, there is provided the method of driving the high-breakdown-voltage semiconductor apparatus of the eleventh aspect, further comprising the steps of:

applying a third voltage to the at least one of the gates, which is lower than the first voltage, after the application of the first voltage.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be descried with reference to the accompanying drawings.

(First Embodiment)

Figure 1:
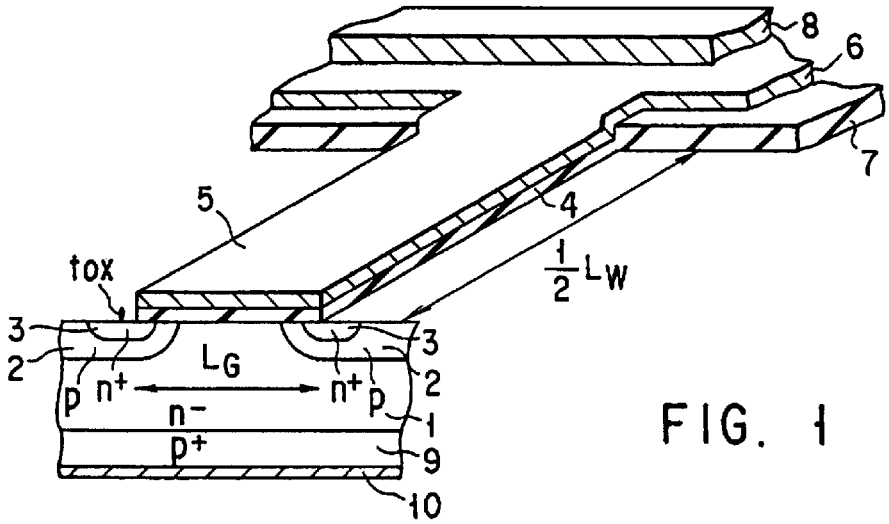
FIG. 1 shows an IGBT according to a first embodiment of the present invention.

FIG. 1 shows an IGBT according to a first embodiment of the present invention. FIG. 1 shows a portion corresponding to one cell of a high-breakdown-voltage semiconductor apparatus in which stripe-shaped IGBTs are integrated. A cross-sectional portion of FIG. 1 shows a central portion of the cell and is taken along a plane perpendicular to a channel width direction.

Reference numeral 1 denotes a high-resistance n-type base layer. A p-type base layer 2 is selectively formed on a surface portion of the n-type base layer 1. An n-type source layer 3 with high impurity concentration is selectively formed in a surface portion of the p-type base layer 2.

A gate electrode 5 formed of, e.g. polysilicon, is provided above a region of the p-type base layer 2, which lies between the n-type source layer 3 and n-type base layer 1, with a gate insulation film 4 interposed therebetween.

The gate electrode 5 is formed as one piece with a first gate electrode wiring element 6 formed of the same material. A gate wiring insulation film 7 continuous with the gate insulation film 4 is provided under the gate electrode wiring element 6.

A second gate electrode wiring element 8 formed of, e.g. Al, which has a lower resistance than the first gate electrode wiring element 6, is provided on the first gate electrode wiring element 6. Thus, the resistance of the gate electrode wiring (FIG. 1 showing only gate electrode wiring elements 6 and 8 at one end) at both ends of the cell is made sufficiently low.

A p-type drain layer 9 with high impurity concentration is provided on that surface of the n-type base layer 1, which is opposed to the surface thereof on which the p-type base layer 2 is provided. A drain electrode 10 is provided on the p-type drain layer 9. The n-type source layer 3 is provided with a source electrode (not shown) which is in contact with the p-type base layer 2, too.

As regards the IGBT having the above structure, suppose that the gate length is 0.5 LW, the gate electrode width L is G, the sheet resistance of the gate electrode 5 is ρ, the thickness of the gate insulation film 4 is tox, the dielectric constant of the gate insulation film 4 is ϵ, and the rate of increase per unit time of the drain voltage at the time the device is turned off is dV/dt.

Since the resistance of the gate electrode wiring at both ends of the cell is sufficiently low, a maximum potential variation at the time a displacement current flows will occur in a central portion of the cell, i.e. a cross-sectional region in FIG. 1. A displacement voltage V' due to dV/dt in this region is expressed by $$v'=0.5\cdot\epsilon\cdot(L_G/tox)\cdot 0.5\cdot LW\cdot\rho\cdot 0.5\cdot(LW/LG)\cdot(dV/dt) \quad (1)$$

The first line of equation (1) corresponds to gate capacitance Cg [F] of that region of the gate electrode 5 in the half of the cell (shown in FIG. 1), below which a channel is formed. The second line of equation (1) corresponds to resistance Rg [Ω] of that region of the gate electrode 5 under which the channel is formed, i.e. that region of the gate electrode 5 which extends from the central portion of the cell shown in FIG. 1 to the gate electrode wiring elements 6 and 8. Accordingly, the displacement voltage V' [V] due to dV/dt [V/s] of equation (1) can be rewritten as follows:

$$V'=0.5\cdot Cg\cdot Rg\cdot(dV/dt) \quad (2)$$

Accordingly, a voltage, which is higher than a voltage Voff applied to the gate electrode 5 at the time of turn-off by a degree corresponding to a voltage (displacement voltage) due to a displacement current defined by equation (1), is applied the region of the gate electrode 5 which is located at the central portion of the cell.

If the displacement voltage V' exceeds threshold voltage Vth, the device is re-triggered (i.e. malfunctions). In the present embodiment, the gate capacitance Cg and gate resistance Rg are set so as to satisfy the relationship, $|Vth-Voff|\geqq 0.5\cdot Cg\cdot Rg\cdot(dV/dt)$, and thus the device can be exactly turned off. Therefore, a high-breakdown-voltage semiconductor apparatus which can stably operate is obtained.

Since this invention can be achieved merely be designing device parameters and there is no need to adopt a novel device structure, the manufacturing process does not become complex, nor does the manufacturing cost rise.

Even if the width of the gate electrode 5 is increased and the conduction performance is enhanced, the displacement current is suppressed by designing the device parameters, as mentioned above. Accordingly, the switching speed does not lower, and no malfunction will occur.

The width $L_G$ of the gate electrode 5 is an important parameter in determining the conduction characteristics of the IGBT. If the width $L_G$ of gate electrode 5 is too great, the channel density of the IGBT lowers and the conduction characteristics deteriorate. Moreover, the gate capacitance may increase, the cost may arise, and the controllability may deteriorate.

On the other hand, if the width $L_G$ of gate electrode 5 is too small, holes injected from the p-type drain layer 9 are by-passed and not accumulated in the high-resistance N-type base layer 1. As a result, the conduction characteristics deteriorate.

According to the research by the inventor, it has turned out that the channel density and carrier accumulation can be improved and the turn-off voltage can be lowered if the width $L_G$ of gate electrode 5 is set to satisfy the following inequality, irrespective of the presence/absence of the N-type diffusion layer:

$$1\leqq L_G^2/(DB\cdot WB)$$

where DB=the depth of the p-type base layer 2.

This inequality is obtained in the following manner.

The current density i of the IGBT in the state in which conduction modulation has occurred is expressed by $$i=q\cdot n\cdot VF\cdot(\mu e+\mu h)/WB$$

where q=elementary charge quantity, n=the carrier density of electrons and holes, VF=turn-on voltage, μe=the mobility of electrons, and μh=the mobility of holes.

The effective sheet resistance R of the p-type base layer 2 at the time of turn-on is expressed by $$R=1/(q\cdot\mu h\cdot n\cdot DB)$$

Since there is no problem if the voltage drop of a hole current due to the sheet resistance R is equal to or greater than the junction voltage Vj, the following relationship is obtained:

$$i\cdot R\cdot L_G^2/32\geqq Vj$$

If the above three formulae are used, the following is obtained:

$$L_G^2/(DB\cdot WB)\geqq 32Vj\cdot\mu_h/(Vj\cdot\mu_F\cdot(\mu_e+\mu_h))$$

If silicon is used as the material of the device, $\mu_h/(\mu_e+\mu_h)$ is about 0.25 and Vj is about 0.6V. In the state in which the power semiconductor device is normally used, VF is about 4V. Taking these into account, the following is obtained:

$$1\leqq L_G^2/(DB\cdot WB)$$

If the value of $L_G^2/(DB\cdot WB)$ is too great, the channel is reduced and the conduction characteristics deteriorate. In order to prevent the reduction of the channel, it is necessary to set the value of $L_G^2/(DB\cdot WB)$ to 9 or less. Accordingly, it is preferable to meet the condition, $1\leqq=L_G^2/(DB\cdot WB)\leqq 9$.

If the value $L_G$ is too small, holes tend to be by-passed and accumulation of carriers becomes difficult. In particular, in the case of a device having a breakdown voltage of 3 kV or above, the conduction characteristics are fatally degraded by this problem. According to experiments by the inventor, it has turned out that if $L_G$ is 60 μm or above and the above conditions are satisfied, carriers are accumulated.

In addition, it has turned out, by experiments by the inventor, that latch-up will hardly occur if the condition, $2\leqq L_G/L_S$, preferably, $5\leqq L_G/L_S$, is satisfied. Symbol $L_S$ denotes a distance between adjacent gate electrodes. Since the semiconductor apparatus is not easily destroyed and the range for stable operations increases, the protection circuit can be simplified.

When a high breakdown voltage, e.g. 2 kV or above, is to be ensured, the width $L_G$ of the gate electrode 5 is set at 30 μm or above. When a breakdown voltage of 3 kV or above is to be ensured, the width $L_G$ of the gate electrode 5 is set at 30 μm or above.

If the displacement current of each of IGBTs integrated in the apparatus is suppressed by the above method, non-uniform operations of devices, e.g. concentration of current to some of the IGBTs, can be prevented. Therefore, the turn-off performance can be further improved.

The gate capacitance Cg can be easily measured by a capacitance meter or calculated on the basis of the structure of the gate insulation film 4. In addition, the resistance Rg of the gate electrode 5 can be easily measured by a four-terminal method.

(Second Embodiment)

Figure 2:
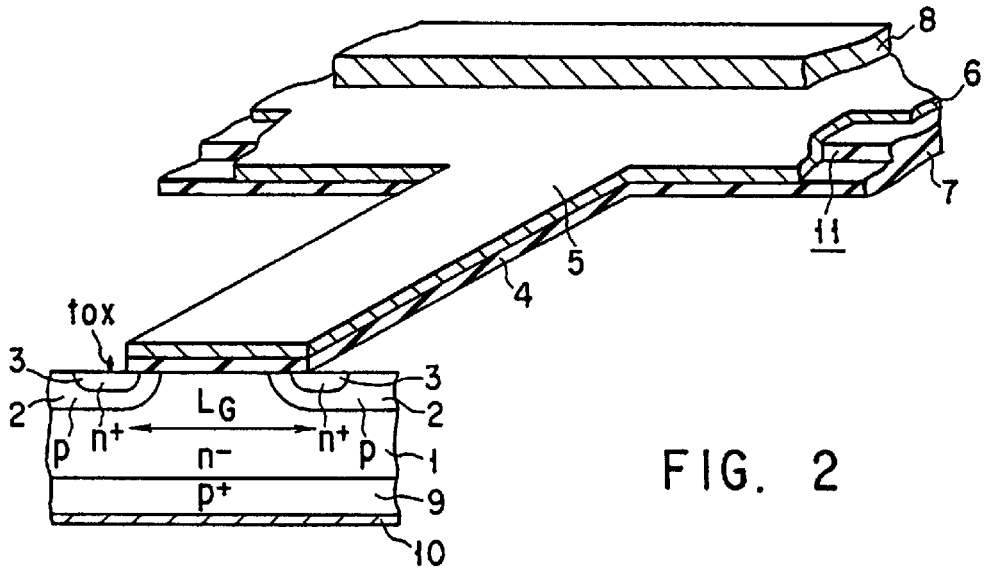
FIG. 2 shows an IGBT according to a second embodiment of the invention.

FIG. 2 shows an IGBT according to a second embodiment of the invention.

The elements common to those of the IGBT shown in FIG. 1 are denoted by like reference numerals, and a description thereof is omitted (the same applied to the subsequent embodiments).

In normal cases, polysilicon is used as the material of the gate electrode 5 and a stepped portion 11 is provided at a region where the gate electrode 5 and gate electrode wiring element 6 are connected. Consequently, there is a concern that the gate electrode 5 and gate electrode wiring element 6 are disconnected at the stepped portion 11 and the device becomes defective.

In the present embodiment, the width of the gate electrode wiring element 6 is increased at the stepped portion 11. Accordingly, even if the connection between the gate electrode 5 and gate electrode wiring element 6 is broken at the stepped portion 11, only part of the gate electrode wiring element 6 is disconnected and the gate electrode wiring element 6 is not completely disconnected at the stepped portion 11.

In this embodiment, like the first embodiment, parameters are set so as to suppress displacement current, and thus the same advantage as the first embodiment can be obtained (the same applies to the other embodiments described below).

(Third Embodiment)

Figure 3:
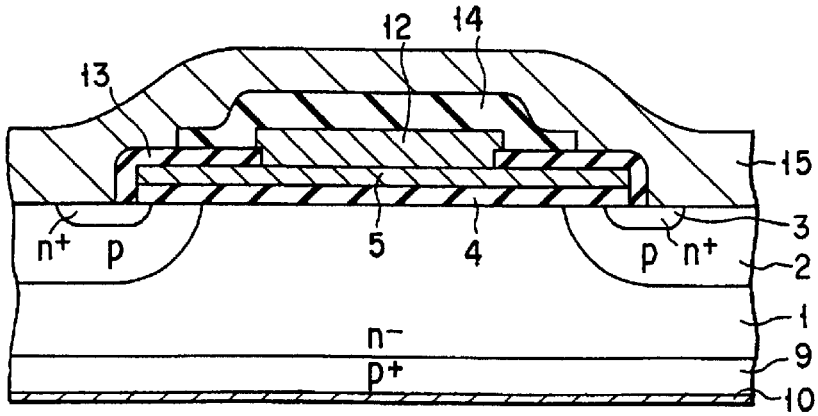
FIG. 3 shows an IGBT according to a third embodiment of the invention.

FIG. 3 is a cross-sectional view showing an IGBT according to a third embodiment of the invention.

This embodiment is characterized in that a low-resistance second gate electrode 12, for example, an Al film or a Cu film, is provided on the gate electrode 5 of a polysilicon. Thus, the gate resistance is decreased as a whole, and a potential variation is suppressed.

The gate electrodes 5 and 12 are covered with an first interlayer insulation film (e.g. oxide film) 13 and a second interlayer insulation film (e.g. polyimide film) 14, respectively. The surface of the device is covered with a source electrode 15. Thereby, various mounting processes such as pressure-contact or bonding can be applied to the device.

In this embodiment, the polysilicon film is used as the first gate electrode 5. If a heavily doped polysilicon film is used, the second gate electrode may be dispensed with. In this case, it will suffice to use an insulation film, such as an oxide film, as the interlayer insulation film 14.

Figure 4:
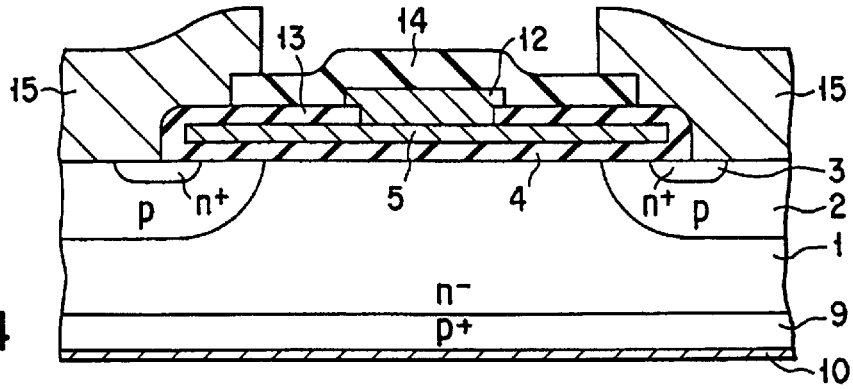
FIG. 4 is a cross-sectional view showing a modification of the IGBT shown in FIG. 3.
Figure 5:
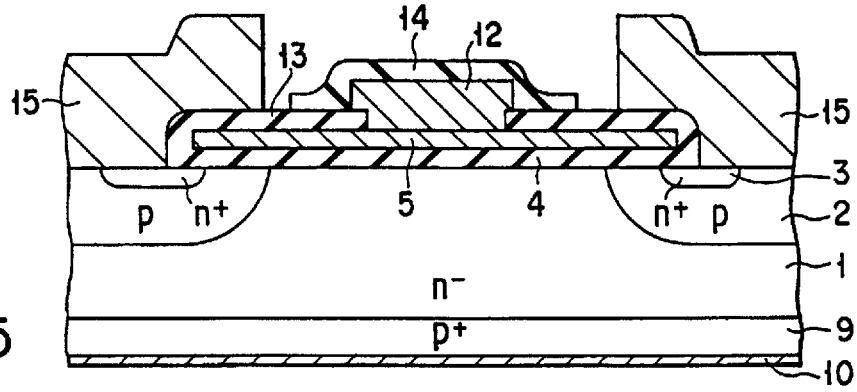
FIG. 5 is a cross-sectional view showing another modification of the IGBT shown in FIG. 3.

FIGS. 4 and 5 show modifications of the third embodiment. FIG. 4 shows an example in which the source electrode 15 is provided over the surface of the device, except a central portion of the second interlayer insulation film 14. FIG. 5 shows an example in which the source electrode 15 is provided over the surface of the device, except the second interlayer insulation film 14 and a surrounding portion of the first interlayer insulation film 13.

As is shown in FIGS. 4 and 5, the source electrode 15 is not provided on the second gate electrode 12.

In these modifications, since the source electrode 15 is not provided over the second gate electrode 12, the second interlayer insulation film 14 having low insulation properties can be used.

(Fourth Embodiment)

Figure 6:
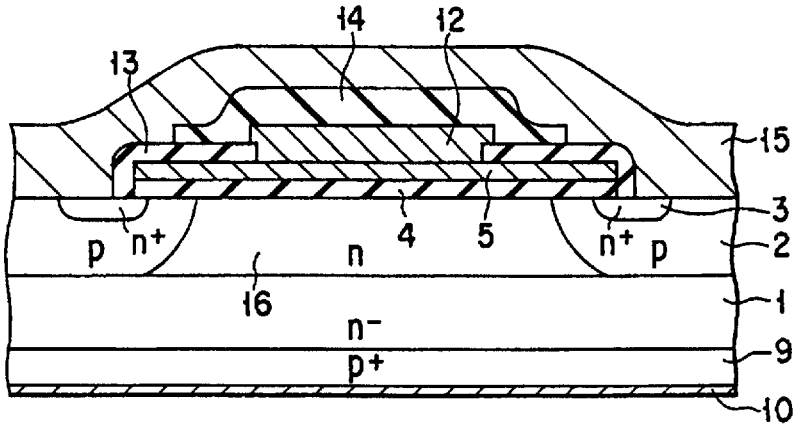
FIG. 6 shows an IGBT according to a fourth embodiment of the invention.

FIG. 6 is a cross-sectional view showing an IGBT according to a fourth embodiment of the invention.

The fourth embodiment differs from the third embodiment in that an n-type emitter layer 16 is provided on the surface of the high-resistance n-type base layer 1, thereby increasing turn-on performance.

From the standpoint of breakdown voltage, it is desirable that the impurity dosage amount of the n-type emitter layer 16 by $1\times10^{13}$ $cm^{-2}$ or less, or the peak concentration be $1\times10^{15}$ $cm^{-3}$ or more and $1\times10^{16}$ $cm^{-3}$ or less. In addition, it is desirable that the depth of the n-type emitter layer 16 be greater than ½ of the depth of the p-type base layer 2.

Figure 7:
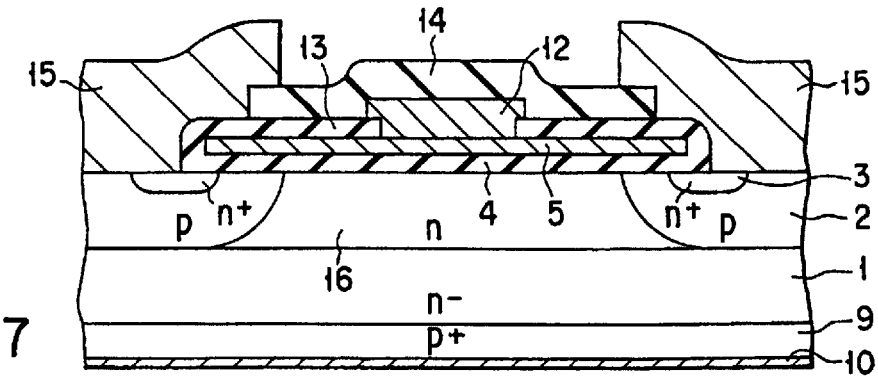
FIG. 7 is a cross-sectional view showing a modification of the IGBT shown in FIG. 6.
Figure 8:
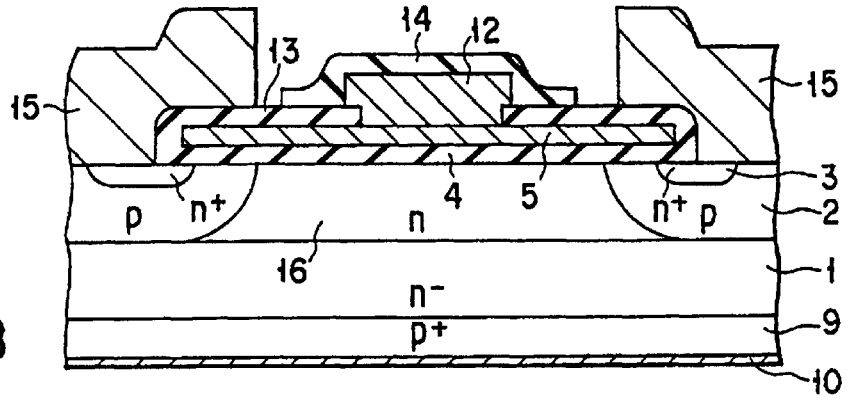
FIG. 8 is a cross-sectional view showing another modification of the IGBT shown in FIG. 6.

FIGS. 7 and 8 show modifications of the fourth embodiment. FIG. 7 shows an example in which an n-type emitter layer 16 is provided in the device according to the modification of FIG. 4. FIG. 8 shows an example in which an n-type emitter layer 16 is provided in the device according to the modification of FIG. 5.

(Fifth Embodiment)

Figure 9:
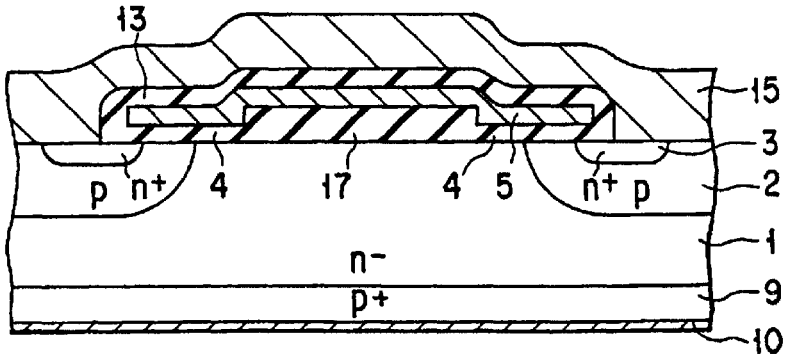
FIG. 9 is a cross-sectional view showing an IGBT according to a fifth embodiment of the invention.

FIG. 9 is a cross-sectional view showing an IGBT according to a fifth embodiment of the invention.

The fifth embodiment is characterized in that the gate electrode 5 is provided over the n-type base layer 1, with a thick insulation film 17 interposed between the gate electrode 5 and a central portion of the n-type base layer 1. No inversion layer is formed just below the base layer 1 under the thick insulation film 17. Thus, the gate electrode 5 in this region is used only for charging/discharging the MOS gate in the region of the gate insulation film 4. As a result, the gate capacitance is decreased, and the resistance of the gate electrode wiring is decreased.

Suppose that the thickness of the gate insulation film 4 is tox, the thickness of the thick insulation film 17 is lox, the threshold voltage is Vth, and the gate voltage $V_G$. In order that no inversion layer may be formed just under the thick insulation film 17, it is necessary that the thickness of the gate insulation film 4 and the thick insulation film 17 have the following relationship:

$$(lax/tox)>V_G/Vth.$$

In general, no problem arises if (lox/tox)>3.

(Six Embodiment)

Figure 10:
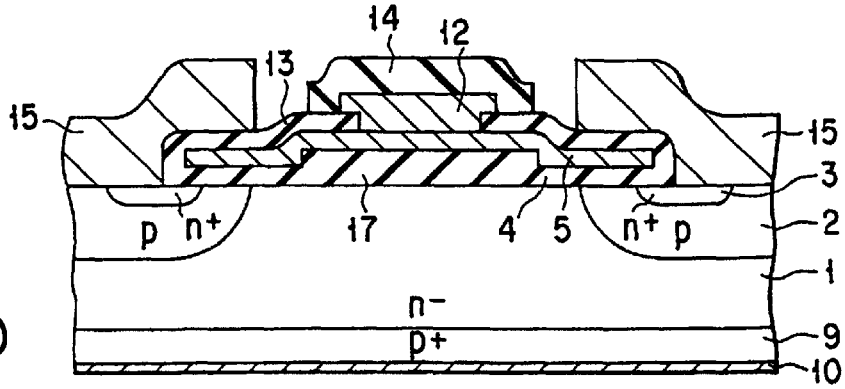
FIG. 10 is a cross-sectional view showing an IGBT according to a sixth embodiment of the invention.

FIG. 10 is a cross-sectional view showing an IGBT according to a sixth embodiment of the invention.

The sixth embodiment differs from the fifth embodiment in that a second gate electrode 12 having a lower resistance than the gate electrode 5 is provided on the gate electrode 5. Thereby, the resistance of the gate electrode decreases as a whole and the potential distribution becomes more uniform. Accordingly, the occurrence of re-striking due to a displacement current can be exactly prevented.

(Seventh Embodiment)

Figure 11:
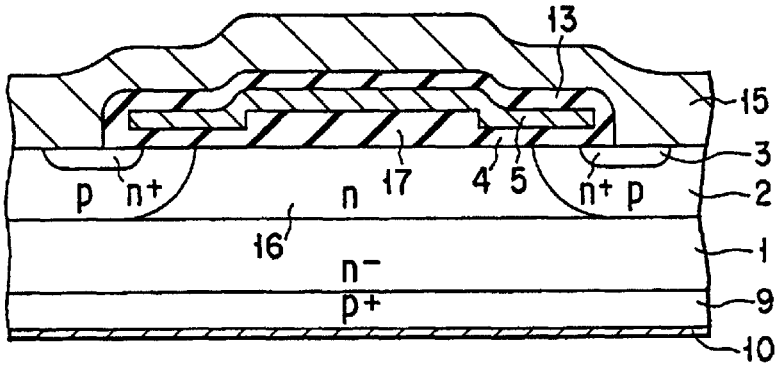
FIG. 11 is a cross-sectional view showing an IGBT according to a seventh embodiment of the invention.

FIG. 11 is a cross-sectional view showing an IGBT according to a seventh embodiment of the invention.

The seventh embodiment differs from the fifth embodiment in that an n-type emitter layer 16 is provided on the surface of the high-resistance n-type base layer 1, thereby enhancing the turn-on performance.

(Eighth Embodiment)

Figure 12:
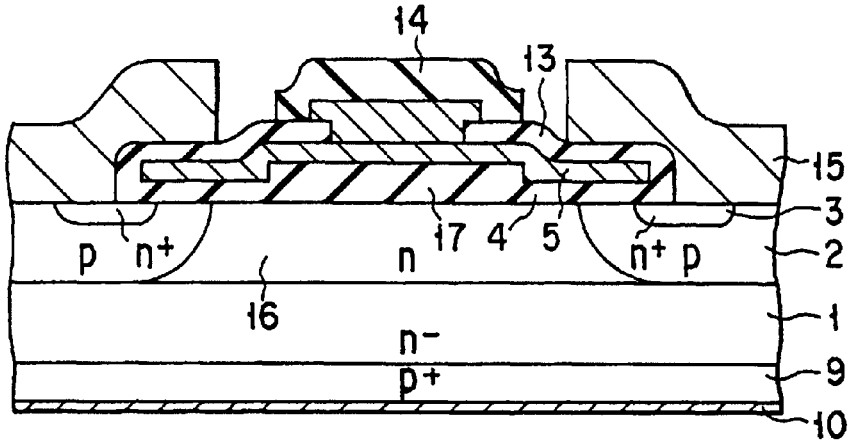
FIG. 12 is a cross-sectional view showing an IGBT according to an eighth embodiment of the invention.

FIG. 12 is a cross-sectional view showing an IGBT according to an eighth embodiment of the invention.

The eighth embodiment differs from the sixth embodiment in that an n-type emitter layer 16 is provided on the surface of the high-resistance n-type base layer 1, thereby enhancing the turn-on performance.

(Ninth Embodiment)

Figure 13:
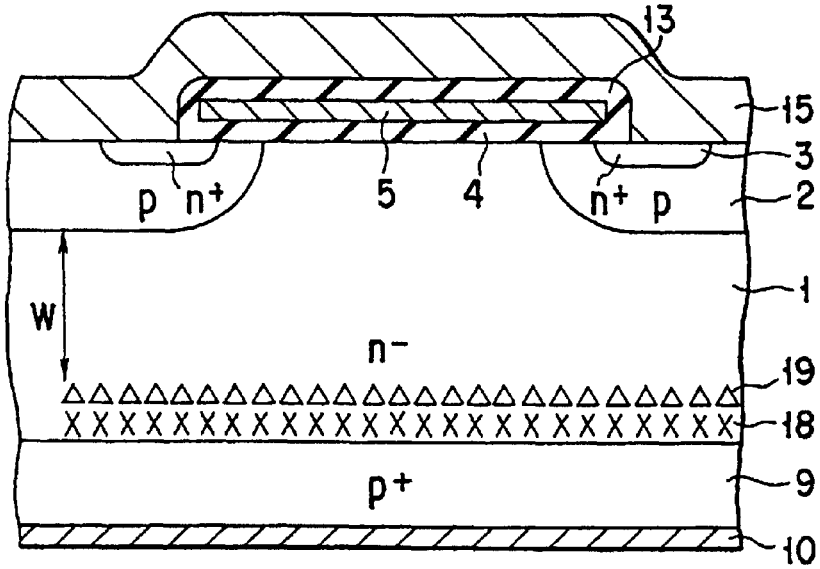
FIG. 13 is a cross-sectional view showing an IGBT according to a ninth embodiment of the invention.
Figure 14:
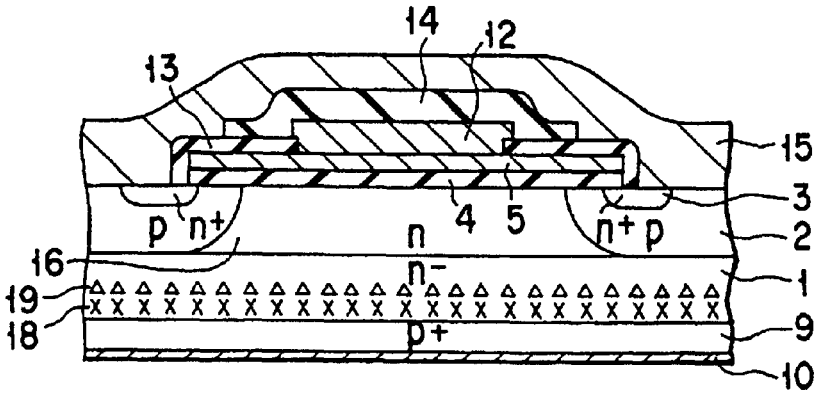
FIG. 14 is a cross-sectional view showing a modification of the IGBT shown in FIG. 13.
Figure 15:
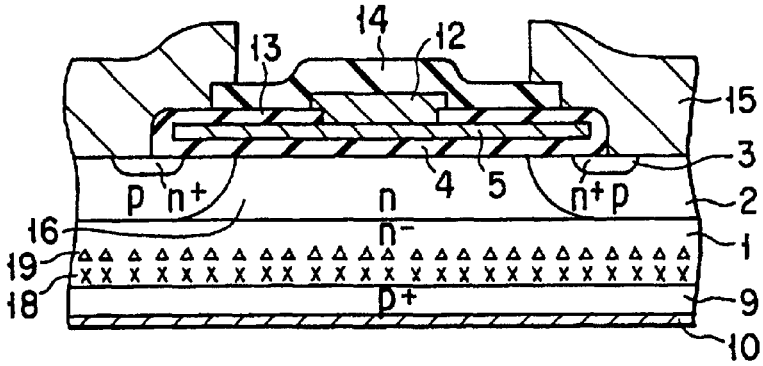
FIG. 15 is a cross-sectional view showing another modification of the IGBT shown in FIG. 13.
Figure 16:
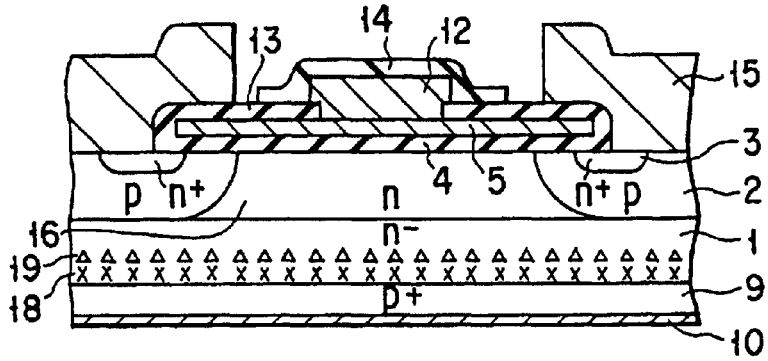
FIG. 16 is a cross-sectional view showing another modification of the IGBT shown in FIG. 13.
Figure 17:
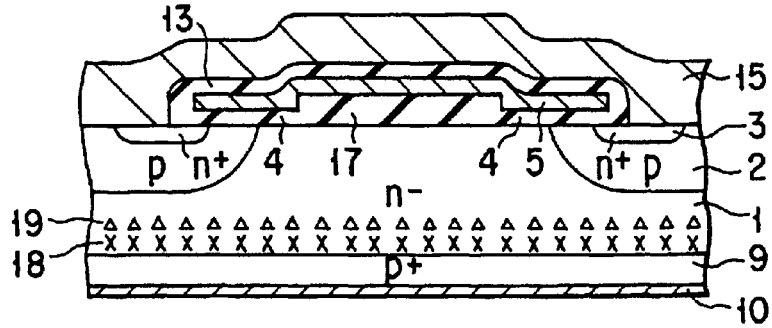
FIG. 17 is a cross-sectional view showing another modification of the IGBT shown in FIG. 13.
Figure 18:
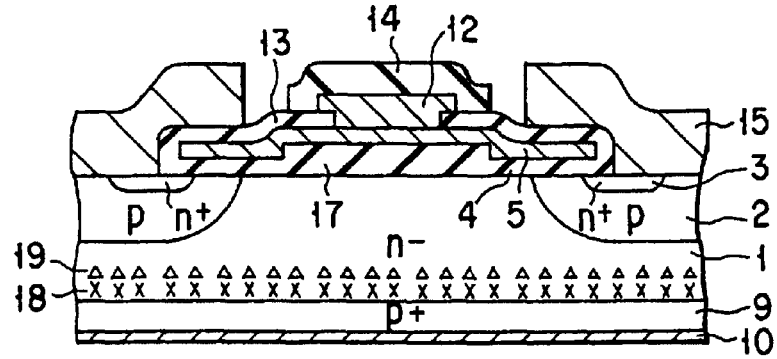
FIG. 18 is a cross-sectional view showing another modification of the IGBT shown in FIG. 13.

FIG. 13 is a cross-sectional view showing an IGBT according to a ninth embodiment of the invention.

This embodiment is characterized in that a local lifetime control is performed to improve a trade-off between a turn-on loss and a switching loss.

In general, this kind of control is effected by radiation of heavy corpuscular beams of protons, helium, etc. The damage ratio of the substrate due to heavy corpuscular beams is high. If the quantity of radiation is increased in order to improve the trade-off, the breakdown voltage deteriorates.

This problem is not limited to static breakdown voltage, but will occur, for example, when a dielectric load is switched or when a surge voltage due to various external noise acts on the device.

This problem is caused by the fact that lattice defects concentrate on a region where heavy corpuscular beams are stopped, because the width at half-maximum of the heavy corpuscular beam at the stop position is narrow (about 10 μm in case of protons, about 5 μm in case of helium).

Under the circumstances, in the present embodiment, the control is not effected by a single radiation operations, but by several radiation operations at different radiation positions, with the quantity of radiation limited to such a level that no damage is caused on the substrate. Thereby, the trade-off can be improved without causing problems such as deterioration of breakdown voltage. It is desirable that the radiation amount be $10^{12}$ $cm^{-2}$ or less.

FIG. 13 shows the state in which radiation is performed twice. Reference numeral 18 denotes a first damage region due to the first radiation, and reference numeral 19 denotes a second damage region due to the second radiation.

The position (depth) of radiation can be easily controlled by varying an acceleration voltage of the radiation apparatus or by inserting a shield plate for deceleration between the radiation apparatus and the device.

If the distance between the end portion of the p-type base layer 2 and the end of the radiation region is W [cm], the position of radiation should desirably satisfy the condition:

$$W=\{2\cdot Es\cdot Vc/(q\cdot N)\}^2$$

where Es=the dielectric constant [F/cm] of n-type base layer 1, q=elementary charge quantity, N=impurity concentration [$cm^{-3}$] of n-type base layer 1, and Vc=a maximum voltage [V] applied when the device is normally used.

In order to increase the switching speed of the semiconductor device, the above-described local lifetime control method may be combined with a method of increasing the width of the control region by radiating corpuscles several times or a lifetime control method such as electron beam radiation or heavy metal (Au, Pt, etc.) diffusion. Thereby, the carrier accumulation state in the semiconductor device can be optimally controlled, and the loss at the switching time can be reduced without increasing the loss at the normal turn-on time.

FIGS. 14 to 18 show modifications of the present embodiment. FIGS. 14 to 18 show structures obtained by applying the local lifetime control of the present embodiment to the devices of FIGS. 6 to 10.

FIGS. 19 to 22 show specific horizontal patterns of the second gate electrode (low-resistance gate electrode) 12.

Figure 19:
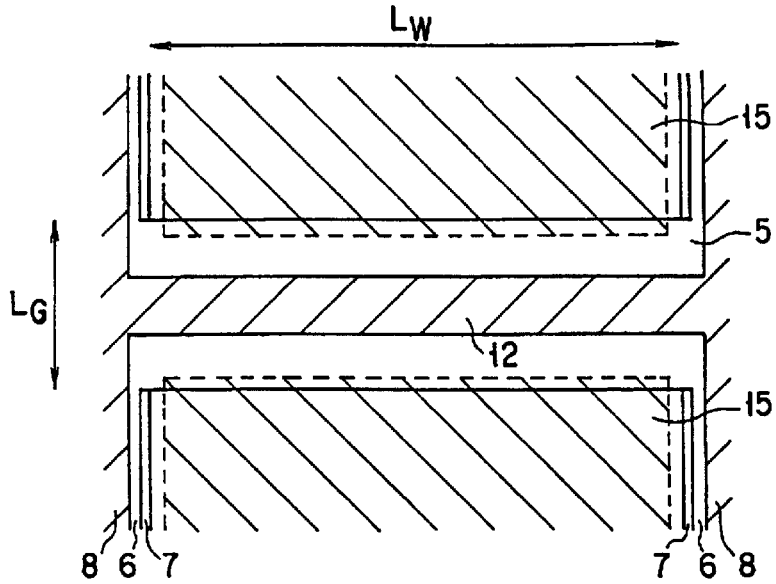
FIG. 19 shows a specific horizontal pattern of a second gate electrode (low-resistance gate electrode)

FIG. 19 shows a basic pattern. In this case, the source electrode 15 of each cell needs to be connected later.

Figure 20:
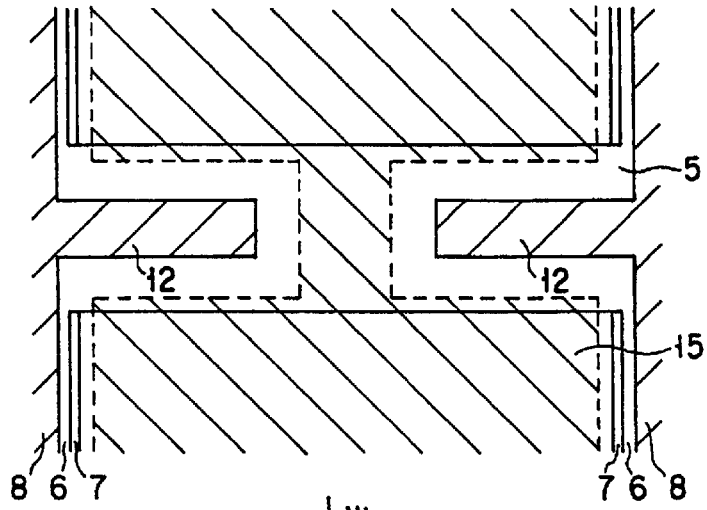
FIG. 20 shows another specific horizontal patter of the second gate electrode (low-resistance gate electrode)

FIG. 20 shows a pattern wherein the source electrode 15 of each cell is connected in advance. Accordingly, a step of connecting the source electrode is not needed, the process is simplified, and a connection defect of the source electrode does not arise.

Figure 21:
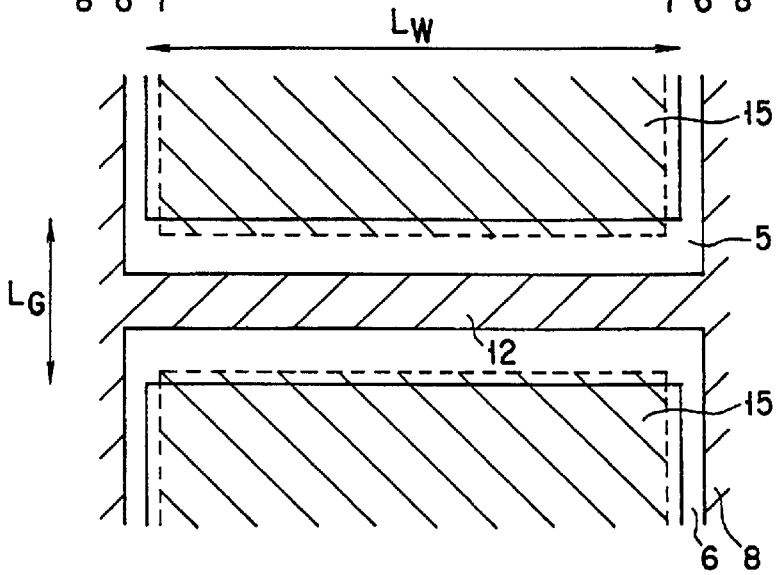
FIG. 21 shows another specific horizontal pattern of the second gate electrode (low-resistance gate electrode)

FIG. 21 shows a pattern wherein the width of the gate electrode wiring element 6 in the pattern of FIG. 19 is increased at the stepped portion, as shown in FIG. 2, thereby preventing breakage at the stepped portion.

Figure 22:
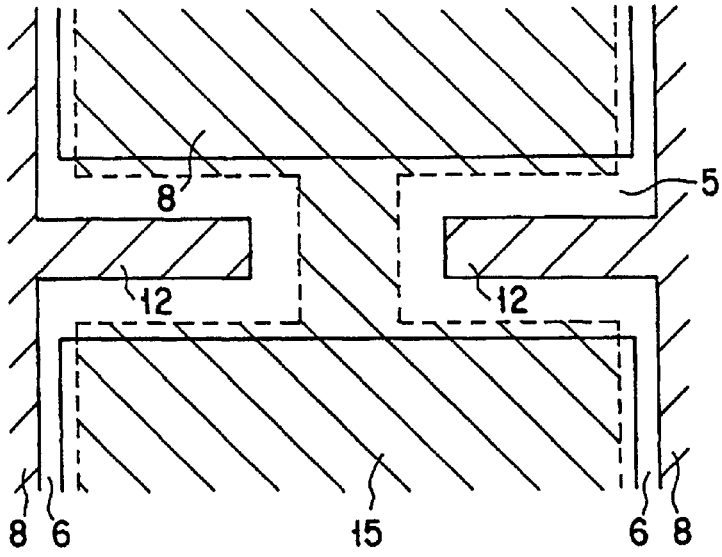
FIG. 22 shows another specific horizontal pattern of the second gate electrode (low-resistance gate electrode)

FIG. 22 shows a pattern wherein the width of the gate electrode wiring element 6 in the pattern of FIG. 20 is increased at the stepped portion, as shown in FIG. 2, thereby preventing breakage at the stepped portion.

In each of the above embodiments, the gate capacitance Cg and gate resistance Rg are set to meet the condition:

$$|Vth-Voff|\geqq 0.5\cdot Cg\cdot Rg\cdot(dV/dt)$$

Figure 23:
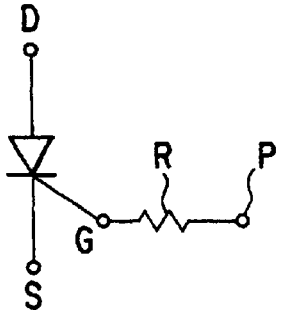
FIG. 23 is a view for explaining a method of decreasing dV/dt.

This formula may be satisfied by lowering the value dV/dt by adopting improved designs of the respective circuit components. For example, as shown in FIG. 23, the value dV/dt can be easily decreased by inserting a resistor R in series between a gate electrode G of the device and a connection terminal P of the gate power supply.

Figure 30:
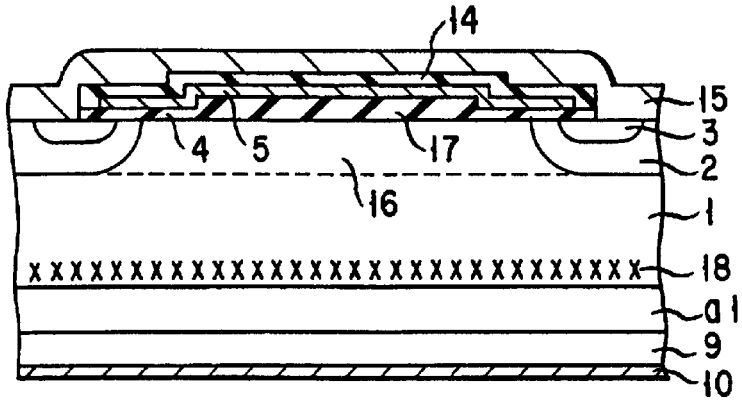
FIGS. 30 to 32 show modifications of the high-breakdown-voltage semiconductor apparatus according to the ninth embodiment of the invention.

FIG. 30 shows a high-breakdown-voltage semiconductor apparatus according to another embodiment of the invention.

In power semiconductor apparatuses, it is necessary to increase the switching speed in order to improve the controllability, or to control the lifetime of carriers in order to reduce the loss at the switching time.

In particular, in a semiconductor apparatus which is used in a range of breakdown voltage exceeding 3 kV, a local lifetime control using radiation of corpuscles such as protons or helium is effective in order to improve a trade-off between a loss at a normal turn-on time and a loss at a switching time.

In the present embodiment, the local lifetime control is performed for the semiconductor apparatus wherein part of the gate oxide film 4 is thickened and the gate capacitance is reduced, thus enhancing the turn-off performance.

It is desirable, as shown in FIG. 30, that the region 18 for the local lifetime control be located in the n-type base layer 1 near the p-type emitter layer 9. In the case of the semiconductor apparatus using an n-type buffer layer a1, it is desirable to perform the local lifetime control near a boundary between the n-type buffer layer and n-type base layer, in particular, on the n-type buffer layer side.

By performing the local lifetime control at such a region, injection of holes from the p-type emitter layer can be efficiently controlled, and a tail current can be reduced and the switching loss also reduced at the switching time, in particular, turn-off time, without degrading the forward voltage effect at the normal turn-on time.

It is desirable that the radiation amount at this time be $10^{12}$ $cm^{-2}$ or less. If the radiation amount is too large, crystal defects will increase in the substance used in the semiconductor apparatus and as a result the breakdown voltage deteriorates and the tail current increases.

Furthermore, in order to increase the switching speed of the semiconductor device, the above-described local lifetime control method may be combined with a method of increasing the width of the control region by radiating corpuscles several times or a lifetime control method such as electron beam radiation or heavy metal (Au, Pt, etc.) diffusion. Thereby, the carrier accumulation state in the semiconductor device can be optimally controlled, and the loss at the switching time can be reduced without increasing the loss at the normal turn-on time.

Since the local lifetime control is performed on the p-type emitter layer side, the dV/dt control in this invention is hardly influenced and the turn-off performance is not degraded.

Figure 31:
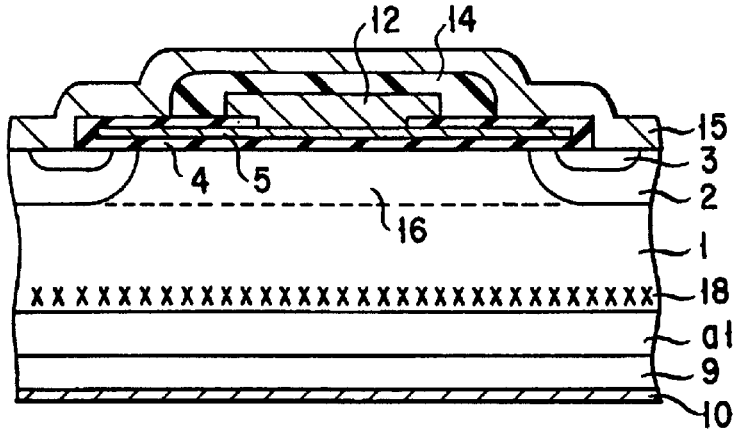

FIG. 31 shows a high-breakdown-voltage semiconductor apparatus according to another embodiment of the invention.

In this embodiment, the local lifetime control is performed by using, instead of the semiconductor apparatus shown in FIG. 30, a semiconductor apparatus wherein the turn-off performance is enhanced by providing a low-resistance film 12 (a metal such as Al, Cu or W; a silicide compound of such metal; a heavily doped polysilicon) for reducing the resistance of the gate electrode on the gate electrode 5.

In this case, too, the same advantage as the structure shown in FIG. 30 can be obtained.

Figure 32:
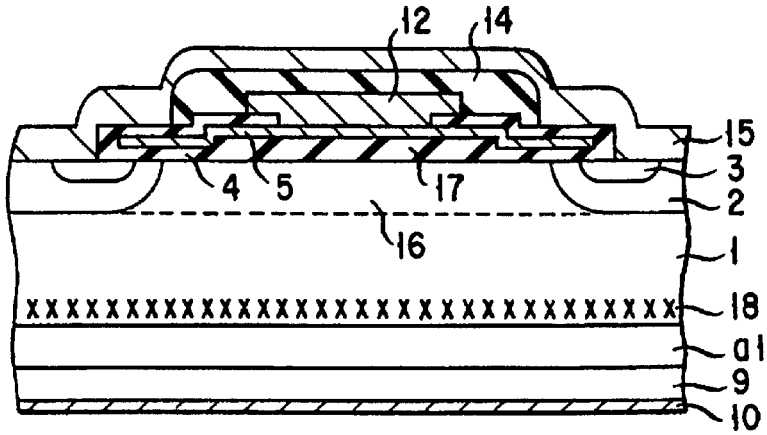

FIG. 32 shows a high-breakdown-voltage semiconductor apparatus according to another embodiment of the invention.

In this embodiment, the local lifetime control is performed for a semiconductor apparatus wherein the turn-off performance is further enhanced by combining the method of enhancing the turn-off performance by partially thickening the gate oxide film and the method of enhancing the turn-off performance by reducing the resistance of the gate electrode, as shown in FIGS. 30 and 31.

(Tenth Embodiment)

Figure 24:
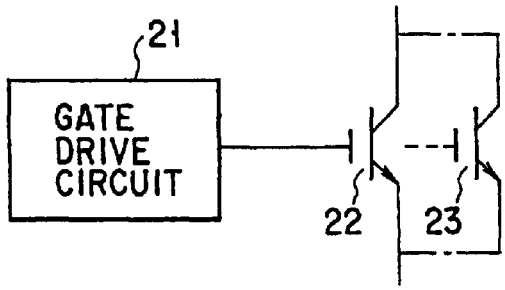
FIG. 24 shows a system to which a driving method according to a tenth embodiment of the invention is applied.

A tenth embodiment of the invention relates to a method of driving an insulated gate type semiconductor device such as a power MOSFET, IGBT, MCT (MOS Controlled Thyristor), etc. In this embodiment, as shown in FIG. 24, parallel-connected insulated gate type semiconductor devices 22 and 23 are driven by a gate drive circuit 21. The gate drive circuit 21 is connected to the gates of the insulated gate type semiconductor devices 22 and 23.

In the actual apparatus, the gate drive circuit 21 is connected to the gates of a number of insulated gate type semiconductor devices. In this embodiment, however, only two insulated gate type semiconductor devices 22 and 23 are shown for the purpose of simpler description. The insulated gate type semiconductor devices 22 and 23 may be provided in a single chip or different chips. There is no problem if the parallel-connected devices are gate-driven at the same time.

Figure 25:
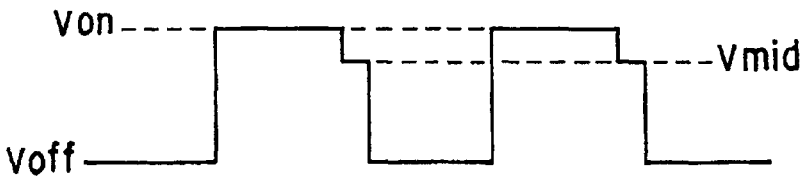
FIG. 25 shows an output waveform (gate drive voltage waveform) of a gate drive circuit shown in FIG. 24.

FIG. 25 shows an output waveform (gate drive voltage waveform) of the gate drive circuit 21 at the time of tuning on the insulated gate type semiconductor devices 22 and 23.

In this embodiment, unlike the prior art, a turn-on gate voltage Von does not directly shift to a turn-off gate voltage Voff at the time of turning off. As is shown in FIG. 25, the gate voltage is retained at an intermediate gate voltage Vmid for a predetermined time period and then shifts to the gate voltage Voff.

Thereby, a variance of cut-off current among devices becomes smaller than in the case where the gate voltage is retained at Von. In addition, since the quantity of charge accumulated in the gate capacitance is small, a variance of turn-off operations also decreases.

Figure 26:
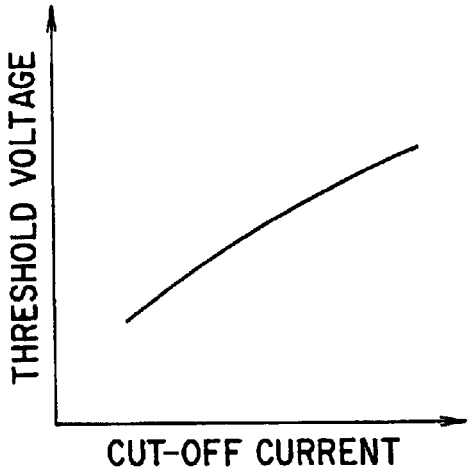
FIG. 26 shows a relationship between a cut-off current and a threshold voltage.

FIG. 26 shows a relationship between the cut-off current and threshold voltage (Vth). As is shown in FIG. 26, a positive relation exists between the cut-off current and the threshold voltage. The greater the cut-off current, the higher the threshold voltage.

There may occur such a device that as the threshold voltage increases, the gate current (=(Vth−Voff)/Rg) at the turn-off time increases accordingly and the mirror time period becomes shorter than a predetermined value (normally about 1 μsec in order to obtain stable cut-off characteristics). As a result, an electric current shared among the devices at the time of turn-off operation varies, and some device may share a current exceeding the limit. Consequently, a current which can be stably cut off is limited. In normal cases, a resistor for setting a mirror time period at a predetermined value is provided between a gate drive circuit and an insulated gate type semiconductor device. If there is a variance in resistance, the same problem of sharing current arises. In addition, the same problem arises if cells having different gate wiring resistance are provided in a single chip.

Even if there is such a variance in resistance, the current can be stably cut off by properly choosing a level or a period of an intermediate gate voltage Vmid so as to reduce a variation in the sharing of current.

Figure 27:
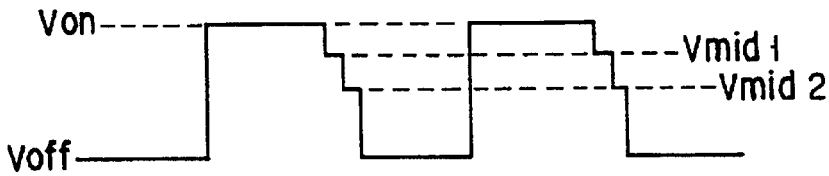
FIG. 27 shows another output waveform (gate drive voltage waveform) of the gate drive circuit.

FIG. 27 shows a modification of the present embodiment, wherein two intermediate gate voltages Vmid1 and Vmid2 are provided. Three or more intermediate gate voltages may be provided.

(Eleventh Embodiment)

Figure 28:
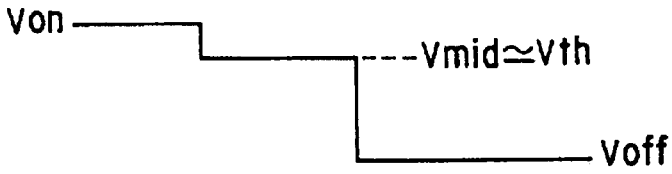
FIG. 28 shows an output waveform (gate drive voltage waveform) of a gate drive circuit according to an eleventh embodiment of the invention.

In the present embodiment, the gate drive voltage waveform shown in FIG. 28 is adopted in the structure shown in FIG. 24, thereby to turn on/off the insulated gate type semiconductor devices 22 and 23.

Specifically, the present embodiment is characterized in that the intermediate gate voltage Vmid is set at about the threshold voltage Vth ($Vth<Vmid<Vth+\Delta V$; $\Delta V$ being capable of being set in units of 1V in modern technology).

In the present embodiment, the time period of intermediate gate voltage Vmid is set to be longer than a mirror time period in the prior art. Thereby, even when the gate voltage is set at threshold voltage Vth, the operation state of the device may enter the normal state in which a displacement current of gate capacitance hardly flows. Thus, a variance in cut-off current among devices can be suppressed, and the devices can be turned off at a time with no operational variance by the gate voltage Voff. Furthermore, the value dV/dt can be reduced by the same effect as in the case of inserting a resistor between the gate drive circuit and the gate terminal of the semiconductor device.

Figure 29:
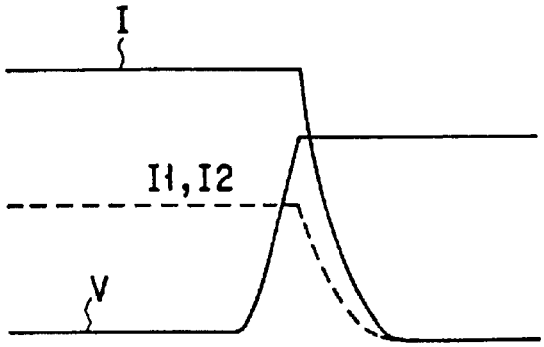
FIG. 29 shows a turn-off waveform and a sharing current in a case of using a driving method according to the eleventh embodiment of the invention.

FIG. 29 shows a turn-off waveform and shared currents I1 and I2 of two device 22 and 23 in a case where the drive method of this embodiment is adopted. It is understood, from FIG. 29, that a turn-off waveform similar to that of the prior art is obtained and the shared currents I1 and I2 are well balanced.

As has been described above, according to the present invention, the formula, $|Vth-Voff| \geqq 0.5 \cdot Cg \cdot Rg \cdot (dV/dt)$, is set and the displacement current which will cause malfunction of devices is set below a level at which re-striking may occur. Thereby, a high-breakdown-voltage with stable operations can be achieved.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A high-breakdown-voltage semiconductor apparatus comprising:

a first-conductivity-type base layer;

a second-conductivity-type base layer formed on a surface of the first-conductivity-type base layer;

a first-conductivity-type source layer formed on a surface of the second-conductivity-type base layer;

a gate electrode provided over that portion of the second-conductivity-type base layer, which is interposed between the first-conductivity-type source layer and the first-conductivity-type base layer, with a gate insulation film interposed between the gate electrode and the interposed portion of the second-conductivity-type base layer;

a second-conductivity-type drain layer formed on a surface of the first-conductivity-type base layer, which is opposed to the surface thereof on which the second-conductivity-type base layer;

a drain electrode put in contact with the second-conductivity-type drain layer; and a source electrode put in contact with the first-conductivity-type source layer and the second-conductivity-type base layer, wherein when a gate capacitance of that portion of the gate electrode, under which a channel is formed, is Cg [F], a resistance in a channel length direction of that portion of the gate electrode, under which the channel is formed, is Rg [Ω], a threshold voltage, which is to be applied to the gate electrode and application of which permits flow of a drain current, is Vth [V], a voltage to be applied to the gate electrode to cut off the drain current is Voff [V], and a ratio of increase in the drain voltage per unit time at the time of cutting off the drain current is dV/dt [V/s], the following condition is satisfied:

$$|Vth-Voff| \geqq 0.5 \cdot Cg \cdot Rg \cdot (dV/dt)$$

2. The high-breakdown-voltage semiconductor apparatus according to claim 1, wherein a width of that portion of the gate electrode, at which the gate electrode is connected to gate electrode wiring, is greater than a width of the gate electrode.

3. The high-breakdown-voltage semiconductor apparatus according to claim 1, further comprising a second gate electrode formed on the gate electrode.

4. The high-breakdown-voltage semiconductor apparatus according to claim 3, wherein the gate electrode and the second gate electrode are covered with insulation films.

5. [The high-breakdown-voltage semiconductor apparatus according to claim 3] *A high-breakdown-voltage semiconductor apparatus having an array of cells, each cell comprising:*

*a first-conductivity-type base layer;*

*a second-conductivity-type base layer formed on a surface of the first-conductivity-type base layer;*

*a first-conductivity-type source layer formed on a surface of the second-conductivity-type base layer;*

*a first gate electrode provided over that portion of the second-conductivity-type base layer, which is interposed between the first-conductivity-type source layer and the first-conductivity-type base layer, with a gate insulation film interposed between the first gate electrode and the interposed portion of the second-conductivity-type base layer;*

*said first gate electrode including a first part and a second part, the second part being wider than the first part;*

*a second gate electrode formed on the second part of the first gate electrode and over the first conductivity-type base layer;*

*a source layer formed on a surface of the first-conductivity-type base layer, which is opposed to the surface thereof on which the second-conductivity-type base layer;*

*a drain electrode put in contact with the drain layer; and*

*a source electrode put in contact with the drain layer; and*

*a source electrode put in contact with the first-conductivity-type source layer and the second-conductivity-type base layer,* wherein the source electrode is not provided on the second gate electrode.

6. The high-breakdown-voltage semiconductor apparatus according to claim 1, further comprising a first-conductivity-type emitter layer formed on the first-conductivity-type base layer and having an impurity dosage of $1\times10^{13}$ [$cm^{-3}$] or less and a peak concentration of $1\times10^{15}$ [$cm^{-3}$] or more and $1\times10^{16}$ [$cm^{-3}$] or less.

7. The high-breakdown-voltage semiconductor apparatus according to claim 1, wherein a thickness of that portion of the gate insulation film, which is formed below a central portion of the gate electrode, is different from a thickness of that portion of the gate insulation film formed below an end portion of the gate electrode.

8. The high-breakdown-voltage semiconductor apparatus according to claim 1, further comprising a resistor connected between the gate electrode and a gate power supply.

9. The high-breakdown-voltage semiconductor apparatus according to claim 1, wherein when a width of the gate electrode is $L_G$, a depth of the first-conductivity-type base layer is $D_B$, a thickness of the second-conductivity-type base layer is $W_B$, and a distance between the gate electrodes is $L_S$, the following condition is satisfied:

$$60\ \mu m \leqq L_G,\ 5 \leqq L_G/L_S, \text{ and } 1 \leqq L_G^2/(D_B \cdot W_B) \leqq 9$$

[10. A high-breakdown-voltage semiconductor apparatus comprising:

a first-conductivity-type base layer;

a second-conductivity-type base layer formed on a surface of the first-conductivity-type base layer;

a first-conductivity-type source layer formed on a surface of the second-conductivity-type base layer;

a gate electrode provided over that portion of the second-conductivity-type base layer, which is interposed between the first-conductivity-type source layer and the first-conductivity-type base layer, with a gate insulation film interposed between the gate electrode and the interposed portion of the second-conductivity-type base layer;

a second-conductivity-type drain layer formed on a surface of the first-conductivity-type base layer, which is opposed to the surface thereof on which the second-conductivity-type base layer;

a drain electrode put in contact with the second-conductivity-type drain layer; and a source electrode put in contact with the first-conductivity-type source layer and the second-conductivity-type base layer, wherein when a gate capacitance of that portion of the gate electrode, under which a channel is formed, is Cg [F], a resistance in a channel length direction of that portion of the gate electrode, under which the channel is formed, is Rg [Ω], a threshold voltage, which is to be applied to the gate electrode and application of which permits flow of a drain current, is Vth [V], a voltage to be applied to the gate electrode to cut off the drain current is Voff [V], and a ratio of increase in the drain voltage per unit time at the time of cutting off the drain current is dV/dt [V/s], the following condition is satisfied:

$$|Vth-Voff| \geqq 0.5 \cdot Cg \cdot Rg \cdot (dV/dt)$$

and wherein the first-conductivity-type base layer is subjected to a local lifetime control process.]

[11. A method of a driving high high-breakdown-voltage semiconductor apparatuses, wherein each of the high high-breakdown-voltage semiconductor apparatuses comprises:

a first-conductivity-type base layer;

a second-conductivity-type base layer formed on a surface of the first-conductivity-type base layer;

a first-conductivity-type source layer formed on a surface of the second-conductivity-type base layer;

a gate electrode provided over that portion of the second-conductivity-type base layer, which is interposed between the first-conductivity-type source layer and the first-conductivity-type base layer, with a gate insulation film interposed between the gate electrode and the interposed portion of the second-conductivity-type base layer;

a second-conductivity-type drain layer formed on a surface of the first-conductivity-type base layer, which is opposed to the surface thereof on which the second-conductivity-type base layer;

a drain electrode formed on the second-conductivity-type drain layer; and a source electrode put in contact with the first-conductivity-type source layer and the second-conductivity-type base layer, wherein when a gate capacitance of that portion of the gate electrode, under which a channel is formed, is Cg [F], a resistance in a channel length direction of that portion of the gate electrode, under which the channel is formed, is Rg [Ω], a threshold voltage, which is to be applied to the gate electrode and application of which permits flow of a drain current, is Vth [V], a voltage to be applied to the gate electrode to cut off the drain current is Voff [V], and a ratio of increase in the drain voltage per unit time at the time of cutting off the drain current is dV/dt [V/s], the following condition is satisfied:

$$|Vth-Voff| \geqq 0.5 \cdot Cg \cdot Rg \cdot (dV/dt)$$

and wherein the method of driving the high-breakdown-voltage semiconductor apparatuses comprises the steps of:

applying a first voltage to at least one of gates of the high-breakdown-voltage semiconductor apparatus, which is lower than a gate voltage at turn-on time, and applying a second voltage for turning off to the at least one of the gates, which is lower than the first voltage.]

[12. The method of driving the high-breakdown-voltage semiconductor apparatus according to claim 11, further comprising the steps of:

applying a third voltage to the at least one of the gates, which is lower than the first voltage, after the application of the first voltage.]

*13. The high-breakdown-voltage semiconductor apparatus according to claim 5, wherein the source electrode is provided on the first gate electrode.*

*14. The high-breakdown-voltage semiconductor apparatus according to claim 1,*

*wherein the first-conductivity-type base layer is subjected to a local lifetime control process.*

*15. A method of driving a high-breakdown-voltage semiconductor apparatuses, wherein each of the high-breakdown-voltage semiconductor apparatuses comprises:*

*a first-conductivity-type base layer;*

*a second-conductivity-type base layer formed on a surface of the first-conductivity-type base layer;*

*a first-conductivity-type source layer formed on a surface of the second-conductivity-type base layer;*

*a gate electrode provided over that portion of the second-conductivity-type base layer, which is interposed between the first-conductivity-type source layer and the first-conductivity-type base layer, with a gate insulation film interposed between the gate electrode and the interposed portion of the second-conductivity-type base layer;*

*a second-conductivity-type drain layer formed on a surface of the first-conductivity-type base layer, which is opposed to the surface thereof on which the second-conductivity-type base layer;*

*a drain electrode formed on the second-conductivity-type base layer; and*

*a source electrode put in contact with the first-conductivity-type source layer and the second-conductivity-type base layer,*

*wherein when a gate capacitance of that portion of the gate electrode, under which a channel is formed, is Cg (F),*

*a resistance in a channel length direction of that portion of the gate electrode, under which the channel is formed, is Rg (Ω),*

*a threshold voltage, which is to be applied to the gate electrode and application of which permits flow of a drain current, is Vth (V),*

*a voltage to be applied to the gate electrode to cut off the drain current is Voff (V), and*

*a ratio of increase in the drain voltage per unit time at the time of cutting off the drain current is dV/dt (V/S),*

*the following condition is satisfied:*

$$Vth-Voff>0.5 \cdot Cg \cdot Rg \cdot (dV/dt)$$

*and wherein the method of driving the high-breakdown-voltage semiconductor apparatuses comprises the steps of:*

*applying a first voltage to at least one of gates of the high-breakdown-voltage semiconductor apparatus, which is lower than a gate voltage at turn-on-time; and*

*applying a second voltage for turning off to the at least one of the gates, which is lower than the first voltage.*

*16. The method of driving the high-breakdown-voltage semiconductor apparatus according to claim 15, further comprising the step of:*

*applying a third voltage to the at least one of the gates, which is lower than the first voltage, after the application of the first voltage.*

*17. A method of driving a high-breakdown-voltage semiconductor apparatuses, wherein each of the high-breakdown-voltage semiconductor apparatuses comprises:*

*a first-conductivity-type base layer;*

*a second-conductivity-type base layer formed on a surface of the first-conductivity-type base layer;*

*a first-conductivity-type source layer formed on a surface of the second-conductivity-type base layer;*

*a gate electrode provided over that portion of the second-conductivity-type base layer, which is interposed between the first-conductivity-type source layer and the first-conductivity-type base layer, with a gate insulation film interposed between the gate electrode and the interposed portion of the second-conductivity-type base layer;*

*a drain layer formed on a surface of the first-conductivity-type base layer, which is opposed to the surface thereof on which the second-conductivity-type base layer;*

*a drain electrode formed on the drain layer; and*

*a source electrode put in contact with the first-conductivity-type source layer and the second-conductivity-type base layer,*

*wherein when a gate capacitance of that portion of the gate electrode, under which a channel is formed, is Cg (F),*

*a resistance in a channel length direction of that portion of the gate electrode, under which the channel is formed, is Rg (Ω),*

*a threshold voltage, which is to be applied to the gate electrode and application of which permits flow of a drain current, is Vth (V),*

*a voltage to be applied to the gate electrode to cut off the drain current is Voff (V), and*

*a ratio of increase in the drain voltage per unit time at the time of cutting off the drain current is dV/dt (V/s),*

*the following is satisfied:*

$$Vth-Voff>0.5\cdot Cg\cdot Rg\cdot(dV/dt)$$

*and wherein the method of driving the high-breakdown-voltage semiconductor apparatuses comprises the steps of:*

*applying a first voltage to at least one of gates of the high-breakdown-voltage semiconductor apparatus, which is lower than a gate voltage at turn-on time, and*

*applying a second voltage for turning off to the at least one of the gates, which is lower than the first voltage.*

* * * * *